United States Patent

Hush

[11] Patent Number: 5,854,615
[45] Date of Patent: Dec. 29, 1998

[54] MATRIX ADDRESSABLE DISPLAY WITH DELAY LOCKED LOOP CONTROLLER

[75] Inventor: Glen E. Hush, Boise, Id.

[73] Assignee: Micron Display Technology, Inc., Boise, Id.

[21] Appl. No.: 720,877

[22] Filed: Oct. 3, 1996

[51] Int. Cl.$^6$ .............................. G09G 3/36; G09G 5/00; H03L 7/00

[52] U.S. Cl. .......................... 345/99; 345/100; 345/205; 348/540; 348/541

[58] Field of Search ..................... 345/98–101, 204–208, 345/540, 541; 348/537

[56] References Cited

U.S. PATENT DOCUMENTS

| | | | |
|---|---|---|---|
| 3,500,102 | 3/1970 | Crost et al. | 313/109 |
| 3,761,617 | 9/1973 | Tsuchiya et al. | 178/7.3 D |
| 3,793,628 | 2/1974 | Gaur | 340/324 M |
| 3,883,778 | 5/1975 | Kaji et al. | 315/205 |
| 4,020,280 | 4/1977 | Kaneko et al. | 358/242 |
| 4,238,770 | 12/1980 | Kobayashi et al. | 358/154 |
| 4,511,926 | 4/1985 | Crossland et al. | 358/236 |
| 4,514,727 | 4/1985 | Van Antwerp | 340/793 |
| 4,542,527 | 9/1985 | Tsunekawa | 382/52 |
| 4,616,259 | 10/1986 | Moran et al. | 358/148 |
| 4,652,778 | 3/1987 | Hosoya et al. | 307/603 |
| 4,743,096 | 5/1988 | Wakai et al. | 350/333 |
| 4,748,510 | 5/1988 | Umezawa | 358/236 |
| 4,866,349 | 9/1989 | Weber et al. | 315/169.4 |
| 4,890,101 | 12/1989 | Carlson | 340/811 |
| 4,922,240 | 5/1990 | Duwaer | 340/784 |
| 4,940,916 | 7/1990 | Borel et al. | 313/306 |
| 5,103,144 | 4/1992 | Dunham | 315/366 |
| 5,129,850 | 7/1992 | Kane et al. | 445/24 |
| 5,132,794 | 7/1992 | Okada et al. | 358/153 |
| 5,153,574 | 10/1992 | Kondo | 340/784 |
| 5,189,515 | 2/1993 | Chen | 358/157 |
| 5,196,839 | 3/1993 | Johary et al. | 340/793 |
| 5,212,426 | 5/1993 | Kane | 315/169.1 |
| 5,245,431 | 9/1993 | Okada et al. | 358/154 |
| 5,262,698 | 11/1993 | Dunham | 315/169.1 |
| 5,303,046 | 4/1994 | Masuda | 348/500 |
| 5,359,256 | 10/1994 | Gray | 313/169 |
| 5,459,483 | 10/1995 | Edwards | 345/98 |
| 5,519,414 | 5/1996 | Gold et al. | 345/208 |

FOREIGN PATENT DOCUMENTS

| | | |
|---|---|---|
| 0 476 585 | 3/1992 | European Pat. Off. |
| 1 334 553 | 12/1963 | France . |
| 39 40 750 | 6/1991 | Germany . |

OTHER PUBLICATIONS

Cathey, David A., Jr. "Field Emission Displays," Micron Display Technology, Inc., Bosie, Idaho, undated.

Lee, Kon Jiun "Current Limiting of Field Emitter Array Cathodes," Excerpt of Thesis (p. 162), Georgia Inst. of Technology, Aug. 1986.

Yokoo, J.; Arai, M.; Mori, M.; Bae, J.; Ono, S. "Active Control of Emission Current of Field Emitter Array," *Revuew le Vide, les Couches Minces* 271 (Suppl.): 58–61, Mar./Apr. 1994.

*Primary Examiner*—Jeffery Brier
*Assistant Examiner*—David L Lewis
*Attorney, Agent, or Firm*—Seed and Berry LLP

[57] ABSTRACT

A matrix addressable display includes a delay locked loop formed from a delay chain formed from several variable delay blocks and a comparator. The delay locked loop receives a horizontal sync portion of an image signal and propagates the horizontal sync through the chain of delay blocks. The output of the last delay block drives the comparator that also receives an undelayed horizontal sync component. The comparator compares the undelayed horizontal sync to the delayed horizontal sync component and produces an error signal corresponding to the phase difference. The error signal is input to each of the delay blocks. In response to the error signal, the delay of the respective delay blocks increases or decreases to reduce the phase difference between the undelayed horizontal sync component and the delayed sync component. In addition to driving the delay chain, the horizontal sync component also walks a "1" through a row driver to sequentially activate rows of the array.

35 Claims, 3 Drawing Sheets

MATRIX ADDRESSABLE DISPLAY WITH DELAY LOCKED LOOP CONTROLLER

STATEMENT AS TO GOVERNMENT RIGHTS

This invention was made with government support under Contract No. DABT-63-93-C-0025 by Advanced Research Projects Agency. The government has certain rights to this invention.

TECHNICAL FIELD

This invention relates to visual display systems, and more particularly to systems for maintaining synchronization of picture signals of visual display devices.

BACKGROUND OF THE INVENTION

Current visual display devices such as televisions typically employ cathode ray tubes ("CRTs"). Most televisions are driven by an analog video signal, which in North America, is governed by the NTSC standard. The standard NTSC signal, and other standard television signals, include both video and synchronizing ("sync") signals. In a color television, the video signals include luminance (i.e., intensity) and chrominance (ie., color) information. The sync signal includes horizontal and vertical synching pulses and horizontal and vertical blanking intervals. The horizontal synching pulses synchronize the horizontal sweep of the CRT's scanning electron gun with the source that produces the NTSC signal. Similarly, the vertical sync pulses synchronize fields or frames of displayed information on the CRT.

The horizontal blanking interval is a period that compensates for the time required for the electron gun to return from the right-hand side back to the left-hand side of the screen between the display of adjacent lines on the CRT. Likewise, the vertical blanking interval is a period that compensates for the time required for the electron gun to return from the bottom to the top of the screen between the display of consecutive frames. Well known circuitry coupled to the CRT synchronizes and drives the electron gun in response to the video and synchronizing signals of the television signal to produce a coherent picture. CRTs, however, are bulky, heavy and consume significant amounts of power. Therefore, alternative displays have been developed such as liquid crystal displays ("LCDs"), field emission displays and plasma displays. Such displays are typically referred to as "matrix displays" because they include an M row by N column matrix of display cells or "pixels."

Typically, individual display cells in the matrix are individually addressed by means of pointer signals. For example, a given row is first addressed by a row pointer signal. Then, each column is serially addressed by an analog column signal including luminance and chrominance information. The row pointer signal and column signal are produced in response to an image signal, such as a television signal, by auxiliary circuitry that converts the horizontal and vertical sync pulses into clock and addressing signals for addressing and writing information to each display cell in the matrix array.

One method of producing the column pointer signals is to couple successive outputs of a shift register to successive column drivers where each column driver is coupled to a successive column of the matrix array. Then, a single "1" is entered into the first cell of the shift register and "walked" through the shift register in response to a column clock. As the "1" arrives at each successive cell, the "1" activates the corresponding column driver. In response, the column driver couples chrominance and luminance information to the column of the matrix array.

One drawback of the above described approach is that, as the number of columns in displays increases, the number of cells in the shift register increases, making the shift register increasingly expensive. Moreover, as the number of columns increases and the refresh rate of the display increases, the demand on the column clock increases. Further, the shift register and the shift register driving circuitry consume a significant amount of power and can create a significant amount of noise, thereby degrading operation of the display.

SUMMARY OF THE INVENTION

A matrix addressable display for producing an image in response to an image signal includes a delay locked loop including a delay chain formed from a series of variable delay circuits. In one embodiment, the display is controlled by a driving circuit that receives an image signal, such as an NTSC signal. The driving circuit includes a sync stripping circuit that produces a pulsed sync signal in response to a horizontal sync component of the image signal and provides the sync signal to the delay chain. The sync signal then propagates through the delay chain where it is output to a comparator. The comparator receives the delayed sync signal from the delay chain and also receives an undelayed sync signal from the sync stripping circuit. The comparator produces an error signal corresponding to a phase difference between the undelayed sync signal and the output of the delay chain. The comparator provides the error signal to the respective delay circuits in the delay chain. In response to the error signal, the delay of the delay circuits increases or decreases correspondingly to minimize the error signal, until the delay of the delay chain equals the period of the sync signal.

The output of each delay circuit activates a corresponding transfer gate so that, as the sync signal propagates through the delay chain, the transfer gates are activated in sequence. Analog inputs of the transfer gates receive the analog column signal and, when the transfer gates are activated by the delay circuits, the transfer gates provide samples of the analog column signal to respective columns of an array of emitter sets. Thus, as the pulse of the sync signal propagates through the delay chain, the transfer gates provide samples of the analog column signal to successive columns of the array.

In addition to driving the delay chain, the sync signal also clocks a "1" through a row register. The sync stripping circuit provides the initial "1" to the row register in response to a vertical sync component of the image signal. The "1" thus walks through the row register, activating the rows of the array in sequence.

DETAILED DESCRIPTION OF THE INVENTION

Figure 1:
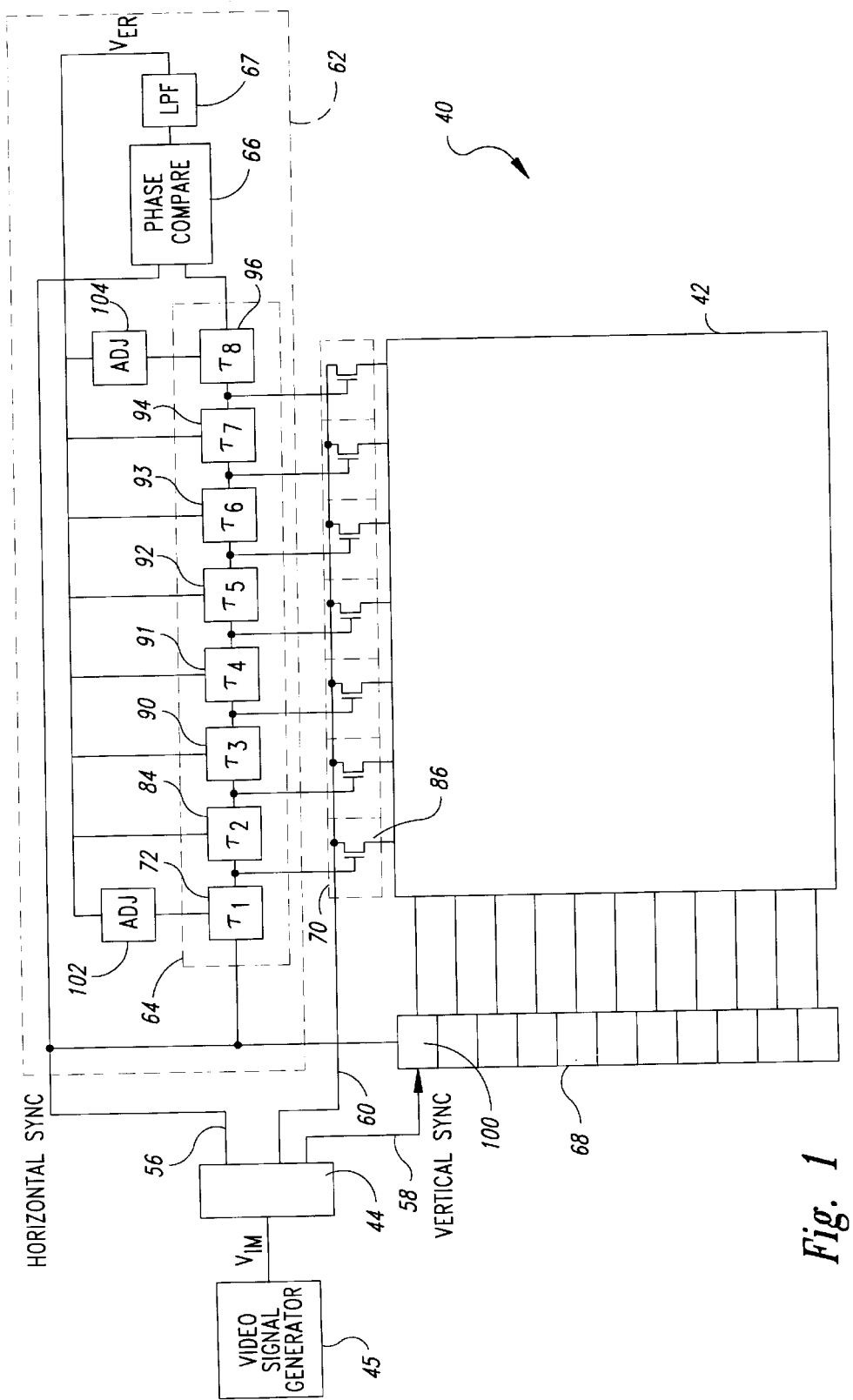
FIG. 1 is a block diagram of a preferred embodiment of a field emission display according to the invention, including a delay chain formed from a series of variable delay circuits.

As shown in FIG. 1, field emission display 40 includes as its central element a matrix array 42. The display 40 is preferably monolithically integrated with the various circuitry described below. The display 40 is generally described herein as a monochrome display; however, the invention can be adapted easily for application as a color display by one of skill in the art. Also, the matrix array 42 is presented as having only seven columns and eleven rows for clarity of presentation, although such matrix arrays typically include hundreds of rows and columns. For example, NTSC arrays commonly include 263 rows and over 500 columns.

Operation of the display 40 responds to an image signal $V_{IM}$ that is received from a video signal generator 45. The video signal generator 45 is a conventional signal source such as a television receiver, VCR, camcorder, computer, or the like. The image signal $V_{IM}$ from the video signal generator 45 drives a sync separator 44. The image signal $V_{IM}$ is typically an NTSC or similar signal carrying video and sync information such as the signal shown in FIG. 2A. Alternatively, in some computer display applications, a display controller may provide the sync and video signals separately. In such applications, the sync separator 44 may be eliminated.

Figure 2:
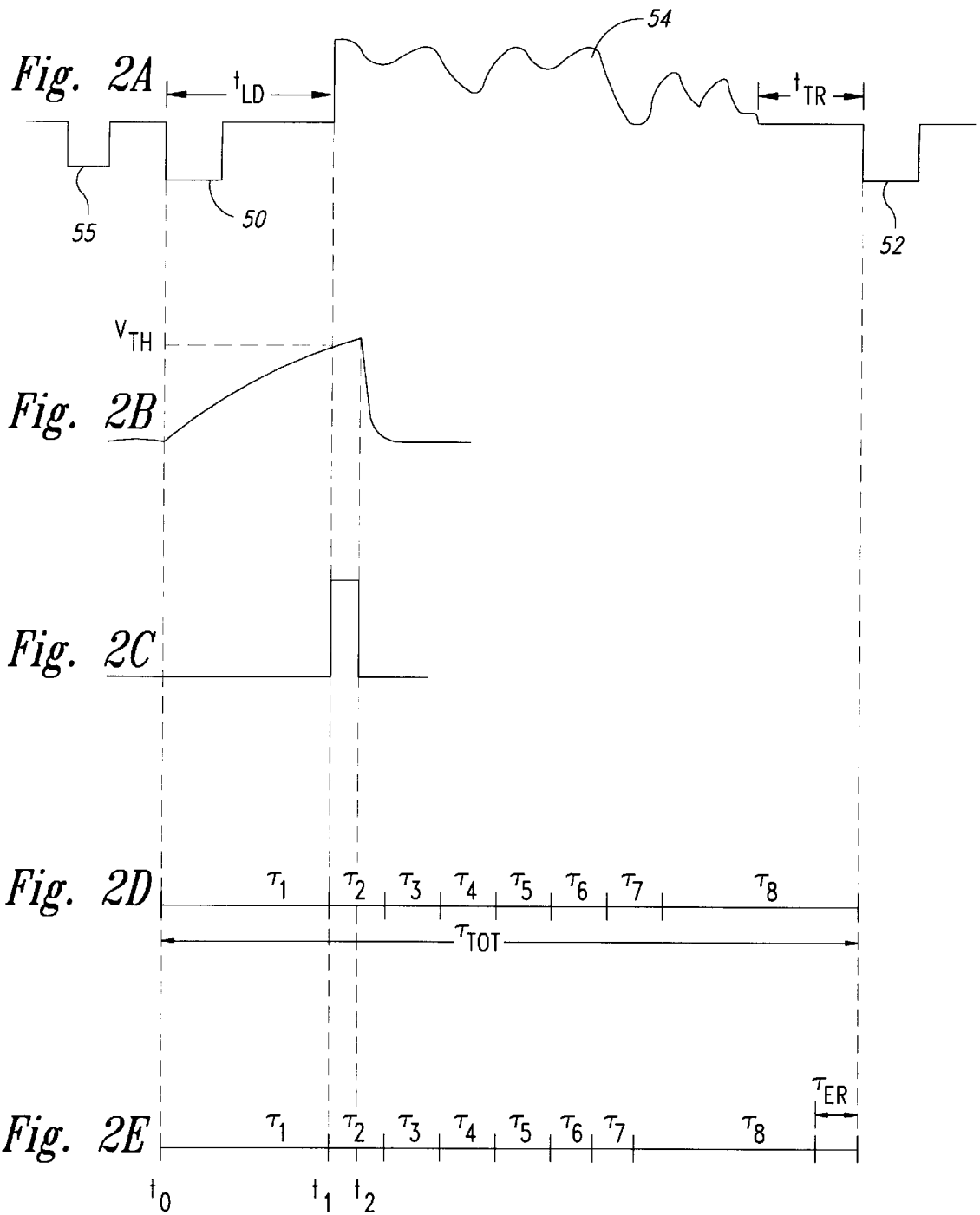
FIG. 2A is a timing diagram showing an NTSC signal, including horizontal sync pulses, a vertical sync pulse and an analog portion.
FIG. 2B is a signal timing diagram showing capacitor voltage in the first delay circuit of FIG. 1.
FIG. 2C is a signal timing diagram of an output pulse from the first delay circuit.
FIG. 2D is a diagrammatic representation of delays of respective delay blocks within the delay chain of FIG. 1.
FIG. 2E is a diagrammatic representation of the delays within the delay chain of FIG. 1 showing an insufficient overall delay time and a corresponding error.

The NTSC signal of FIG. 2A includes first and second horizontal sync pulses 50, 52 and an analog portion 54. The NTSC signal also includes a vertical sync pulse 55 for every horizontal sync pulses 50, 52. The sync separator 44 separates the sync pulses 50, 52, 55 from the analog portion 54 and outputs the horizontal sync pulses 50, 52 on a horizontal sync line 56, the vertical sync pulses 55 on a vertical sync line 58, and the analog portion 54 on a driving line 60. The sync separator 44 inverts the horizontal sync pulses 50, 52 and extends the duration of the horizontal sync pulses 50, 52 to simplify operation of a delay chain 64, as will be described below.

The horizontal sync pulses 50, 52 provide signal inputs to a delay locked loop 62 formed from a delay chain 64, a phase comparator 66, and a low pass filter 67. The horizontal sync pulses 50, 52 also provide a clocking input to a row register 68 that receives the vertical sync pulses 55 as a data input. The analog portion 54 provides a signal input to a transfer gate array 70. Operation and structure of the delay locked loop 62 will be described first.

The delay chain 64 forms the forward transfer portion of the delay locked loop 62. Where the array 42 has N columns, the delay chain will preferably have (N+1) delay blocks, as will be described below. Thus, the delay chain 64 is formed from eight delay blocks 72, 84, 90–94, 96 for the seven column array 42 of FIG. 1. However, one skilled in the art will recognize that the delay chain will typically include many more delay blocks. For example, in a 500-column display 40, the delay chain will have 501 delay blocks.

Each of the delay blocks 72, 84, 90–94, 96 is structured identically, although the values of the components will differ for the first and last delay blocks 72, 96. Therefore, only the structure and operation of the first delay block 72 will be described in detail.

Figure 3:
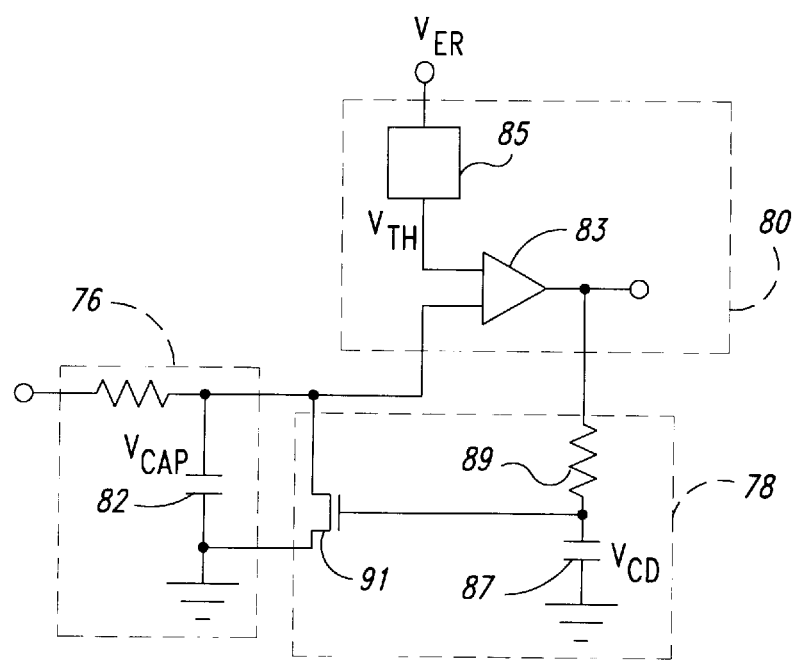
FIG. 3 is a schematic of a delay circuit in the delay chain of FIG. 1.

With reference to FIG. 3, the first delay block 72 is formed from an RC circuit 76, a discharge circuit 78 and a level detector 80. The first horizontal sync pulse 50 is applied to the RC circuit 76 at time $t_0$ and increases a voltage $V_{CAP}$ across a capacitor 82 according to an RC time constant of the RC circuit 76, as shown in FIG. 2B. As the capacitor voltage $V_{CAP}$ increases, the level detector 80 compares the capacitor voltage $V_{CAP}$ to a threshold voltage $V_{TH}$ from a level shifting circuit 85. The level shifting circuit 85 is a conventional circuit that produces the threshold voltage $V_{TH}$ as a level shifted version of an error signal $V_{ER}$, which is developed at the comparator 66, as will be described below. To compare the capacitor voltage $V_{CAP}$ to the threshold voltage $V_{TH}$, a differential amplifier 83 in the level detector 80 receives the capacitor voltage $V_{CAP}$ at a first input and the threshold voltage $V_{TH}$ at a second input. When the capacitor voltage $V_{CAP}$ reaches the threshold voltage $V_{TH}$ of the level detector 80 (i.e., reaches the level shifted error signal $V_{ER}$), the amplifier output goes high at time $t_1$ shown in FIG. 2C. The high output of the amplifier 83 forms an input of a second delay block 84 (FIG. 1) and also begins charging a discharge capacitor 87 in the discharge circuit 78 through a limiting resistor 89. The voltage $V_{CD}$ of the discharge capacitor 87 increases according to the RC time constant of the discharge capacitor 87 and limiting resistor 89. When the discharge capacitor voltage $V_{CD}$ reaches the threshold voltage $V_T$ of the discharge transistor 91 at time $t_2$, the discharge transistor 91 turns ON. The ON discharge transistor 91 quickly discharges the capacitor 82, thereby driving the first input of the amplifier 83 below the threshold voltage $V_{TH}$. In response, the output of the amplifier 83 falls as shown in FIG. 2B. The output of the delay block 72 is thus a pulse that is delayed by a time $\tau_1$ with respect to the input horizontal sync pulse.

The time delay $\tau_1$ of the first delay block 72 is thus determined by the RC time constant of the RC circuit 76, and by the threshold voltage $V_{TH}$ of the level detector 80. As will be explained below, the error signal $V_{ER}$ applied to the level shifting circuit 85 establishes the threshold voltage $V_{TH}$ and thus controls the delay $\tau_1$ of the first delay block 72. Thus, the first delay block 72 has an electrically adjustable time delay $\tau_1$.

The duration of the pulse from the delay block 72 is determined by the RC time constant of the limiting resistor 89 and discharge capacitor 87 and by the threshold voltage $V_T$ of the discharge transistor 91. Thus, the pulse duration is substantially independent of the error signal $V_{ER}$ and of the delay time $\tau_1$.

The second delay block 84 and the following five delay blocks 90–94 are structurally the same as the first delay block 72, except that the component values of the second through seventh delay blocks 84, 90–94 are selected for respective time delays $\tau_2-\tau_7$ that are smaller than the first time delay $\tau_1$. As will be explained in greater detail below, the difference between the first time delay $\tau_1$ and the following six time delays $\tau_2-\tau_7$ allows the first time delay $\tau_1$ to compensate for a leading portion $t_{LD}$ (FIG. 2A) of the horizontal blanking interval while the second through seventh time delays $\tau_2-\tau_7$ correspond to time separation between successive columns of the array 42.

An eighth, and final, delay block 96 follows the seventh delay block 94. The eighth delay block 96 is structurally the same as the first through seventh delay block 72, 84, 90–94 except that the delay $\tau_8$ of the eighth delay block 96 corresponds to a trailing portion $t_{TR}$ (FIG. 2A) of the horizontal blanking interval. The overall delay $\tau_{TOT}$ of the delay chain 64 is thus the sum of the delays $\tau_1$–$\tau_8$ of the individual delay blocks 72, 84, 90–94, 96.

The output of the delay chain 64 resulting from the first horizontal sync pulse 50 is applied to a first input of the comparator 66 where it is compared to the undelayed small horizontal sync pulse 52. In response, the comparator 66 outputs a signal corresponding to the phase difference between the pulses 50, 52. The output signal from the comparator 66 is then low-pass filtered by a filter 67 to produce an error signal $V_{ER}$. In some applications, the filter 67 may also include general level shifting and/or amplifying circuitry to adjust the DC levels and/or amplitude of the error signal $V_{ER}$. The output of the phase comparator 66 can be either positive or negative depending upon the relative phases of the delayed and undelayed horizontal sync signals. When the pulses 52 and the output of the eight delay blocks 96 are exactly synchronized, the error signal $V_{ER}$ has a zero magnitude, indicating no error between the overall delay $\tau_{TOT}$ and the period of the horizontal sync pulses 50, 52.

As described above, the error signal $V_{ER}$ forms the input to each of the threshold detectors 80. Therefore, if the error signal $V_{ER}$ is not zero (i.e., the overall delay $\tau_{TOT}$ does not equal the horizontal sync period) the threshold voltages $V_{TH}$ will shift and the overall delay $\tau_{TOT}$ will change. For example, if the overall delay $\tau_{TOT}$ is greater than the horizontal sync period, the error signal $V_{ER}$ will be negative, lowering the threshold voltages $V_{TH}$ and thereby reducing the time delays $\tau_1$–$\tau_8$ of the delay blocks 72, 84, 90–94, 96. The reduced time delays $\tau_1$–$\tau_8$ reduce the overall delay $\tau_{TOT}$, reducing the difference between the overall delay $\tau_{TOT}$ and the horizontal sync period. Similarly, if the overall delay $\tau_{TOT}$ is too short, the error signal $V_{ER}$ is positive, increasing the time delays $\tau_1$–$\tau_8$ to reduce the error.

In addition to providing portions of the overall delay $\tau_{TOT}$, each of the delay blocks 72, 84, 90–94 also activates a respective transfer gate 86 in the gate array 70. Thus, as the horizontal sync pulse propagates along the delay chain 64, successive transfer gates 86 are activated at intervals corresponding to the time delays $\tau_1$–$\tau_7$. As each transfer gate 86 is activated, it transmits a corresponding part of the analog portion 54 (FIG. 2A) to a respective column of the array 42, because the analog portion 54 forms the driving input of the gate array 70. Thus, each column of the array 42 receives a respective sample of the analog portion 54 as each horizontal sync pulse 50, 52 propagates through the delay chain 64.

At the same time that each horizontal sync pulse 50, 52 is applied to the delay chain 64, the pulse 50, 52 also arrives at a clocking input of the row register 68. As is conventional, the vertical sync pulse 55 arrives before the first horizontal sync pulse 50 and loads a "1" into the first cell 100 of the row register 68. Each horizontal sync pulse 50, 52 clocks the "1" to a subsequent cell of the row register 68 so that the "1" is "walked" completely through the row register 68 every eleven horizontal sync pulses 50, 52.

The output of each cell 100 drives a respective row of the array 42 so that, in response to each successive horizontal sync pulse 50, 52, the row register 68 activates a successive row of the array 42. As described above, each horizontal sync pulse 50, 52 also drives each column of the array 42 with a respective sample of the analog portion 54. Thus, in response to each horizontal sync pulse 50, 52 every column of a successive row of the array 42 is activated with corresponding samples of the analog portion 54. Once all of the rows are activated, a new "1" is loaded into the shift register 68 in response to a new vertical sync pulse 55 and the rows are once again activated by the horizontal sync pulses 50, 52. The delay locked loop 62 avoids the voltage controlled oscillator associated with similar phase lock loop driven circuits, because the timing is driven directly by the horizontal and vertical sync pulses 50, 52, 55.

As noted above, the first and last delay blocks 72, 96 each have a time delay $\tau_1$, $\tau_8$ corresponding to the leading and trailing portions $t_{LD}$, $t_{TR}$ of the horizontal blanking period. To compensate for variations in the blanking interval portions $t_{LD}$, $t_{TR}$ and to provide a "horizontal adjust," respective voltage adjustment circuits 102, 104 are coupled between the output of the low pass filter 67 and the control inputs of the respective level detectors 80. The adjustment circuits 102, 104 shift the voltage level of the error signal $V_{ER}$ to adjust the time delays $\tau_1$, $\tau_8$. The adjustment circuits 102, 104 are preferably level shifting circuits that do not affect variations in the error signal $V_{ER}$ and thus do not affect correction of the time delays $\tau_1$, $\tau_8$. Alternatively, the first and eighth delay blocks 72, 96 can be formed from a plurality of identical circuits so that all of the delay blocks 72, 84, 90–94, 96 can be produced from identical components.

From the foregoing, it will be appreciated that, although an exemplary embodiment of the invention has been described herein for purposes of illustration, various modifications may be made without deviating from the spirit and scope of the invention. For example, the delay locked loop can be used to drive rows of the array, rather than columns of the array, for some applications. Similarly, the delay elements and level detectors can be realized through a variety of conventional circuit elements. Likewise, the delay locked loop 62 can be adapted to respond to vertical sync components or other components of the image signal. Also, although the comparator 66 of FIG. 1 receives the delayed sync signal from the last delay block 96, the comparator 66 can instead be adapted to accept an output from any of the delay blocks 72, 84, 90–94. Moreover, although the display 40 described herein is preferably a field emission display where the matrix array 42 includes an emitter substrate aligned to a display screen, the circuits and methods described herein are applicable to a variety of other matrix addressable displays, such as plasma displays and liquid crystal displays. Further, although the embodiment of FIG. 1 has been described herein as producing a zero voltage when the pulse 52 and the output of the eighth delay block 96 are synchronized, a non-zero error signal $V_{ER}$ can be used to indicate synchronization. Accordingly, the invention is not limited except as by the appended claims.

I claim:

1. A driving circuit for driving a matrix addressable display in response to a driving signal and a sync signal, comprising:

a delay chain including a plurality of serially coupled delay circuits coupled to receive the sync signal, wherein at least a first one of the delay circuits is operative to propagate the sync signal with a variable delay in response to a delay control signal;

a comparator having a first input coupled to receive a delayed signal from a selected second one of the delay circuits and a second input coupled to receive the sync signal, the comparator being operative to compare the delayed signal and the sync signal and to produce the delay control signal in response to the relative phases of the delayed signal and the sync signal; and a first line driver circuit coupled to receive the driving signal and the delayed signal from the delay chain, the line driver circuit being configured to produce samples of the driving signal in response to the delayed signal.

2. The driving circuit of claim 1 wherein the first and second ones of the delay circuits are the same delay circuit.

3. The driving circuit of claim 1 wherein the first line driver circuit includes a bank of transfer gates.

4. The driving circuit of claim 1 wherein the driving signal and sync signal together form an image signal, further including a sync stripping circuit having an output coupled to the delay chain, the sync stripping circuit being configured to strip the sync signal from the image signal and to provide the sync signal to the delay chain.

5. The driving circuit of claim 4 wherein the display is responsive to row and column signals, further including a second line driving circuit coupled to the sync stripping circuit and having an activation output for providing an activation signal, wherein the samples of the driving signal from the first line driving circuit form one of the row and column signals and the activation signal forms the other of the row and column signals.

6. The driving circuit of claim 1 wherein the delay chain and comparator are integrated into a common substrate.

7. The driving circuit of claim 6 wherein the sync strip circuit and the line drive circuit are integrated into the common substrate.

8. An oscillator-free horizontal or vertical scanning circuit for scanning a matrix addressable display in response to a sync signal, comprising:
   a plurality of delay circuits connected in series, each delay circuit having an output terminal and at least one of the delay circuits includes a delay adjust terminal, wherein a first of the delay circuits is configured to receive the sync signal; and
   a phase comparator having a first input receiving the sync signal and a second input coupled to one of the output terminals, the phase comparator further including an error signal output coupled to the delay adjust terminal.

9. The scanning circuit of claim 8, further including a level shifting circuit coupled between the error signal output of the phase comparator and the delay adjust terminals.

10. The scanning circuit of claim 8 wherein the first delay circuit is configured to produce a first delay and a second of the delay circuits is configured to produce a second delay different from the first delay.

11. The scanning circuit of claim 10 wherein the first delay is selected to correspond to a first blanking interval of an image signal.

12. The scanning circuit of claim 10 wherein a third of the delay circuits is configured to produce a third delay different from the first and second delays.

13. A matrix addressable display for producing an image in response to an image signal having an image component and a sync component, comprising:
   a sync stripping circuit coupled to receive the image signal and operative to produce a sync signal in response to the sync component;
   a delay chain including a plurality of serially coupled delay elements coupled to receive the sync signal, wherein each delay element has a variable delay responsive to a delay signal;
   a comparator coupled to receive the sync signal and an output signal of a selected one of the delay elements, the comparator producing the delay signal in response to a phase difference between the sync signal and the output signal of the selected delay element; and
   a first line driving circuit coupled to receive the image component and to receive output signals from the delay elements.

14. The display of claim 13 wherein the first line driving circuit includes a bank of transfer gates.

15. The display of claim 14 wherein the driving signal and sync signal together form an image signal, further including a sync stripping circuit coupled to the delay chain, the sync stripping circuit being configured to strip the sync signal from the image signal and to provide the sync signal to the delay chain.

16. The display of claim 15 wherein the display is responsive to row and column signals, further including a second line driving circuit coupled to the sync stripping circuit and having an activation output for providing an activation signal, wherein the samples of the driving signal from the first line driving circuit form one of the row and column signals and the activation signal forms the other of the row and column signals.

17. The display of claim 13, further including a level shifting circuit coupled between the comparator and the first line driving circuit.

18. The display of claim 13, further including a matrix array integrated into a common substrate with the delay chain.

19. The display of claim 18 wherein the comparator is integrated into the common substrate.

20. An image display apparatus, comprising:
   a video signal generator for producing an image signal;
   a display screen;
   a matrix array aligned to the display screen;
   a sync stripping circuit coupled to receive the image signal and operative to produce a sync signal in response to the sync component;
   a delay chain including a plurality of serially coupled delay elements coupled to receive the sync signal, wherein each delay element has a variable delay responsive to a delay signal;
   a comparator coupled to receive the sync signal and an output signal of a selected one of the delay elements, the comparator producing the delay signal in response to a phase difference between the sync signal and the output signal of the selected delay element; and
   a first line driving circuit coupled to receive the image component and to receive output signals from the delay elements, the first line driving circuit having a plurality of outputs coupled to the matrix array.

21. The image display apparatus of claim 20 wherein the first line driving circuit includes a bank of transfer gates.

22. The image display apparatus of claim 20 wherein the video signal generator is a television receiver.

23. The image display apparatus of claim 20 wherein the video signal generator is a video cassette recorder.

24. The image display apparatus of claim 20 wherein the video signal generator is a camcorder.

25. The image display apparatus of claim 20 wherein the video signal generator is a computer.

26. A method of controlling a matrix addressable display in response to an image signal, the display including an array of light emitting assemblies arranged in rows and columns, comprising the steps of:
   stripping the image signal to produce a sync signal;
   delaying the sync signal a plurality of delay intervals to produce a plurality of delayed signals, each delay interval having a duration;
   after each of a selected plurality of the delay intervals, activating the respective rows or columns of the array in response to the respective delayed signal;

selecting a reference delayed signal from the plurality of delayed signals;

comparing the sync signal and the reference delayed signal; and adjusting the durations of the delay intervals in response to the comparison of the sync signal and the reference delayed signal.

27. The method of claim 26 wherein the sync signal is a horizontal sync signal and the display includes a shift register coupled to the array to activate selected rows of the array, further comprising the steps of:

providing a data bit to a first cell of the shift register; and clocking the data bit through successive cells of the shift register in response to the sync signal.

28. The method of claim 27 wherein the step of providing a first data bit to a first cell of the shift register comprises the steps of:

stripping a vertical sync signal from the image signal; and supplying the stripped vertical sync signal to the shift register.

29. The method of claim 26, further including the step of producing an error signal indicating a timing relationship between the sync signal and the reference delayed signal.

30. The method of claim 29 wherein the step of delaying the sync signal a plurality of delay intervals includes the step of passing the sync signal through a series of delay blocks and the step of adjusting the durations of the delay intervals in response to the comparison of the sync signal and the reference delayed signal includes the steps of:

providing the error signal to the delay blocks; and adjusting the delays of the delay blocks in response to the error signal.

31. The method of claim 30 wherein the step of adjusting the delays of the delay blocks in response to the error signal comprises the step of selectively increasing or decreasing the delays of the delay blocks such that the error signal is reduced.

32. A method of providing a displayed image in a matrix addressable display in response to an image signal having a sync component and an image component, wherein the display includes a display panel including a plurality of display elements, comprising the steps of:

separating the sync component from the image component;

delaying the sync component a selected delay time to produce a delayed sync component;

comparing phases of the delayed sync component and the separated sync component;

adjusting the selected delay time in response to the compared phases to produce an adjusted delayed sync component; and providing the image component to the display elements in response to the adjusted delayed sync component.

33. The method of claim 32, further comprising the step of producing an error signal in response to the step of comparing the pulses of the delayed sync component and the separated sync component.

34. The method of claim 33 wherein the step of adjusting the selected delay time comprises the step of selectively increasing or decreasing the selected delay time to reduce the error signal.

35. The method of claim 34 wherein the step of delaying the sync component a selected time comprises the step of passing the sync component through a chain of delay blocks.

* * * * *